United States Patent
Cheruiyot et al.

(10) Patent No.: US 7,541,881 B2
(45) Date of Patent: Jun. 2, 2009

(54) POWER SUPPLY NOISE INSENSITIVE CHARGE PUMP, LOOP FILTER, VCO CONTROL, AND VCO

(75) Inventors: Kennedy K. Cheruiyot, Rochester, MN (US); Michael T. Repede, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 11/360,352

(22) Filed: Feb. 23, 2006

(65) Prior Publication Data

US 2007/0200636 A1 Aug. 30, 2007

(51) Int. Cl.
*H03L 7/085* (2006.01)

(52) U.S. Cl. ............... 331/17; 331/57; 331/34; 327/157

(58) Field of Classification Search .......... 331/16, 331/17, 18, 25, 34, 175, 177 R, 185, 57; 327/156, 327/157, 536
See application file for complete search history.

(56) References Cited

U.S. PATENT DOCUMENTS

| | | | | |
|---|---|---|---|---|
| 5,559,476 A | * | 9/1996 | Zhang et al. | 331/57 |
| 5,781,048 A | * | 7/1998 | Nakao et al. | 327/157 |
| 6,469,585 B1 | * | 10/2002 | Dai et al. | 331/57 |
| 7,167,056 B2 | * | 1/2007 | Fang et al. | 331/57 |
| 2003/0206042 A1 | * | 11/2003 | Walker et al. | 327/156 |

* cited by examiner

*Primary Examiner*—Robert Pascal
*Assistant Examiner*—Ryan J. Johnson
(74) *Attorney, Agent, or Firm*—Bockhop & Associates LLC

(57) ABSTRACT

An oscillating circuit includes a charge pump, a loop filter and a voltage controlled oscillator. The charge pump and the loop filter generates a differential voltage signal. The loop filter is responsive to the differential voltage signal and generates a filtered differential voltage control signal that is proportional to the differential voltage signal. The voltage controlled oscillator is responsive to the filtered differential voltage control signal and generates a periodic signal that has a frequency that corresponds to the filtered differential voltage control signal.

3 Claims, 2 Drawing Sheets

POWER SUPPLY NOISE INSENSITIVE CHARGE PUMP, LOOP FILTER, VCO CONTROL, AND VCO

BACKGROUND OF THE INVENTION

1. Field of the Invention

The present invention relates to electronic circuits and, more specifically, to an oscillating circuit that employs a phase-locked loop.

2. Description of the Prior Art

A voltage controlled oscillator (VCO) is a circuit that generates a periodic waveform having a frequency that is a function of a voltage input. In many cases, a differential voltage is applied to the VCO, which generates a waveform having a frequency that is linearly proportional to the differential voltage.

Many phase-locked loops (PLLs) that are used as clocking circuits in integrated circuits employ VCOs to generate a stable periodic signal based on the differential voltage applied to it. A PLL is an electronic circuit that controls an oscillator so that it maintains a constant phase angle relative to a reference signal. PLLs are used in a variety of different types of circuits, including communication circuits and digital integrated circuits. Because the VCO is highly sensitive to noise in the differential voltage applied to it, such noise will manifest itself as a deviation from the desired frequency of the PLL. PLLs are extensively utilized as on-chip clock generators to synthesize and de-skew a higher internal frequency from the external lower frequency.

Digital integrated circuit implementations of PLLs frequently experience substrate coupling due to simultaneous circuit switching and power/ground (P/G) noise, which results in a timing jitter. In a PLL, random variation of the phase, or jitter, is a critical performance parameter. When used in a microprocessor (or other type of logic chip), PLL jitter can cause the effective cycle time of the microprocessor to be increased to meet the chip logic timing due to the necessity of avoiding incorrect cycle changes due to noise. This results in reduced yield and thus increases the cost to meet a desired cycle time. Power supply noise is one the main contributors to jitter in PLLs.

Therefore, there is a need for a PLL that minimizes jitter in the differential voltage applied to the VCO contained therein.

SUMMARY OF THE INVENTION

The disadvantages of the prior art are overcome by the present invention which, in one aspect, is an oscillating circuit that includes a charge pump, a loop filter and a voltage controlled oscillator. The charge pump generates a differential voltage signal. The loop filter is responsive to the differential voltage signal and generates a filtered differential voltage control signal that corresponds to the differential voltage signal. The voltage controlled oscillator is responsive to the filtered differential voltage control signal and generates a periodic signal that has a frequency that corresponds to the filtered differential voltage control signal.

In another aspect, the invention is a power source for a voltage controlled oscillator that generates a periodic signal having a frequency that corresponds to a differential voltage between a first voltage input and a second voltage input. The power source includes a charge pump, a loop filter, a first transistor and a second transistor. The charge pump generates a first voltage signal and a complementary second voltage signal corresponding to a desired frequency of the periodic signal. The loop filter is responsive to the charge pump and generates a first filtered signal and a second filtered signal. The first filtered signal corresponds to noise in the first voltage signal and the second filtered signal corresponds to noise in the second voltage signal. The first transistor couples the first voltage signal to a first voltage input. The first transistor has a gate driven by the first filtered signal so that a first virtual voltage is delivered to the first voltage input, wherein the first virtual voltage corresponds to the first voltage signal with any noise subtracted therefrom. The second transistor couples the first voltage signal to a second voltage input. The second transistor has a gate driven by the second filtered signal so that a second virtual voltage is delivered to the second voltage input, wherein the second virtual voltage corresponds to the second voltage signal with any noise subtracted therefrom.

In yet another aspect, the invention is a method of removing a jitter voltage from a differential voltage applied to a jitter-sensitive circuit that responds to the differential voltage. A first differential signal that corresponds to the differential voltage is generated and supplied to an active element that is electrically coupled to the jitter-sensitive circuit. A second differential signal that corresponds to the differential voltage is generated and is filtered so as to generate a filtered signal that corresponds to the jitter voltage. The active element is driven with the filtered signal so that the active element drives the jitter-sensitive circuit with a signal that corresponds to the differential voltage without the jitter voltage.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
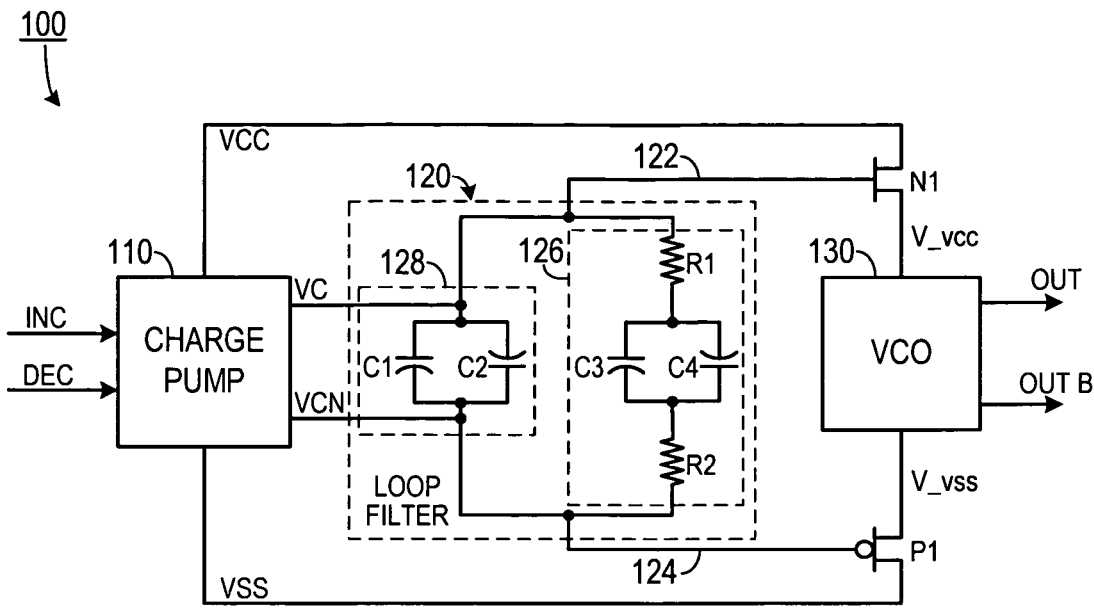
FIG. 1 is a schematic diagram of an oscillating circuit.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIG. 1, one illustrative embodiment of an oscillating circuit 100 according to the invention includes a charge pump 110 that generates a differential voltage signal, including a first power source voltage VCC (and a corresponding first reference voltage VC) and a complementary second voltage signal VSS (and a corresponding second reference voltage VCN). The charge pump 110 contains a common mode circuit that ensures that the average of VC and VCN stays centered at approximately one-half of the difference between VCC and VSS.

The voltage differential between VC and VCN is controlled by asserting an increment signal INC (to increase the differential) and a decrement signal DEC (to decrease the differential). A loop filter 120 filters the noise component from the reference voltages VC and VCN so as to generate a first filtered signal 122 and a second filtered signal 124 that correspond to the VCO voltage V_vcc and V_vss, respectively. The first filtered signal 122 drives the gate of a first transistor N1 (such as an n-type field effect transistor) so as to drive current from the first power source voltage VCC to a first virtual voltage input V_vcc of a voltage-controlled oscillator 130 so that the first virtual voltage input V_vcc has a voltage corresponding to the voltage of the first filtered signal 122. Similarly, the second filtered signal 124 drives the gate of a second transistor P1 (such as an p-type field effect transistor) so as to drive current from the second power source voltage VSS to a second virtual voltage input V_vss of a voltage-controlled oscillator 130 so that the second virtual voltage input V_vss has a voltage corresponding to the voltage of the second filtered signal 124. The first transistor N1 and the second transistor P1 are biased so that V_vcc is isolated from VCC and V_vss is isolated from VSS, respectively. Thus the first transistor N1 and the second transistor P1 act as high impedance sources that filter most jitter or noise that would otherwise be on V_vcc and V_vss. The voltage controlled oscillator 130 generates a periodic signal (OUT and OUTB) having a frequency that corresponds to a differential voltage between a first voltage input and a second voltage input V_vcc and V_vss.

The loop filter 120 may be embodied as a low pass filter that removes the high frequency component of the reference voltages VC and VCN, thereby leaving the DC and low frequency control components of those signals. The loop filter 120 may include a first element 126 that includes a first pair of parallel capacitors C3 and C4 that are disposed electrically between and in series with a first resistor R1 and a second resistor R2. A second element 128 includes a second pair of parallel capacitors C1 and C2. The second element 128 is in parallel with the first element 126. The first element 126 and the second element 128 are electrically coupled to the gate of the first transistor N1 and to a first reference voltage VC from the charge pump at a first node. The first element 126 and the second element 128 are also electrically coupled to the gate of the second transistor P1 and to a second reference voltage VCN from the charge pump at a second node.

Figure 2:
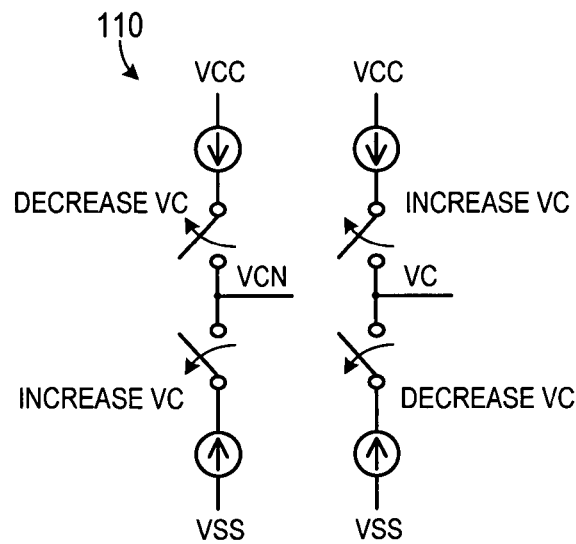
FIG. 2 is a schematic diagram of an example of a charge pump that may be used in the oscillating circuit shown in FIG. 1.
Figure 3:
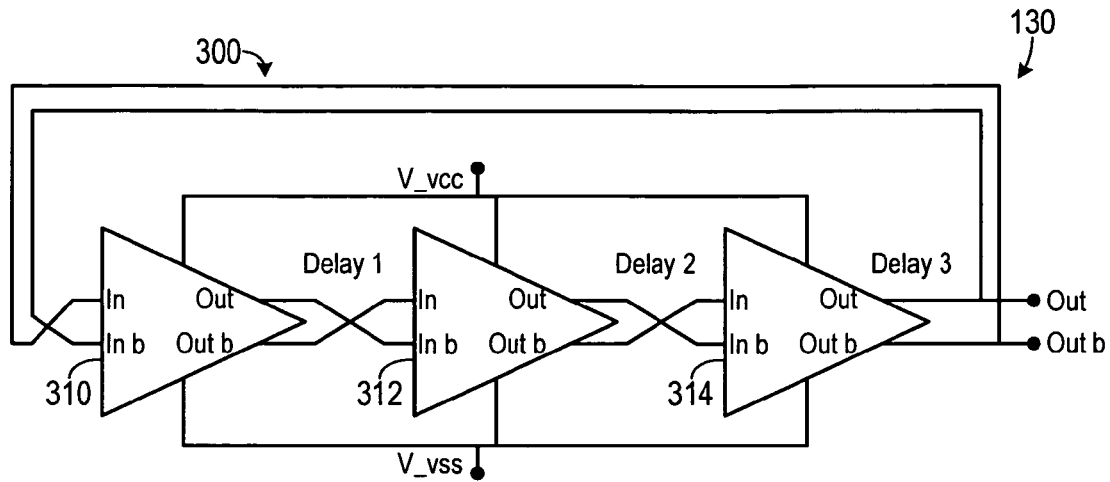
FIG. 3 is a schematic diagram of a phase-locked loop that may be used in the oscillating circuit shown in FIG. 1.

One embodiment of the charge pump 110 is shown in FIG. 2. The "INCREASE VC" signal (corresponding to INC) can be asserted to switch additional current onto the first reference voltage VC. Similarly, the "DECREASE VC" signal (corresponding to DEC) can be asserted to switch additional current onto the second reference voltage VCN. When the PLL is locked on, the INC and the DEC signals are in an "off" state, except for short periods of time. While they are in the "off" state, the values of VC and VCN remain essentially static and isolated from jitter on VCC and VSS.

Figure 4:
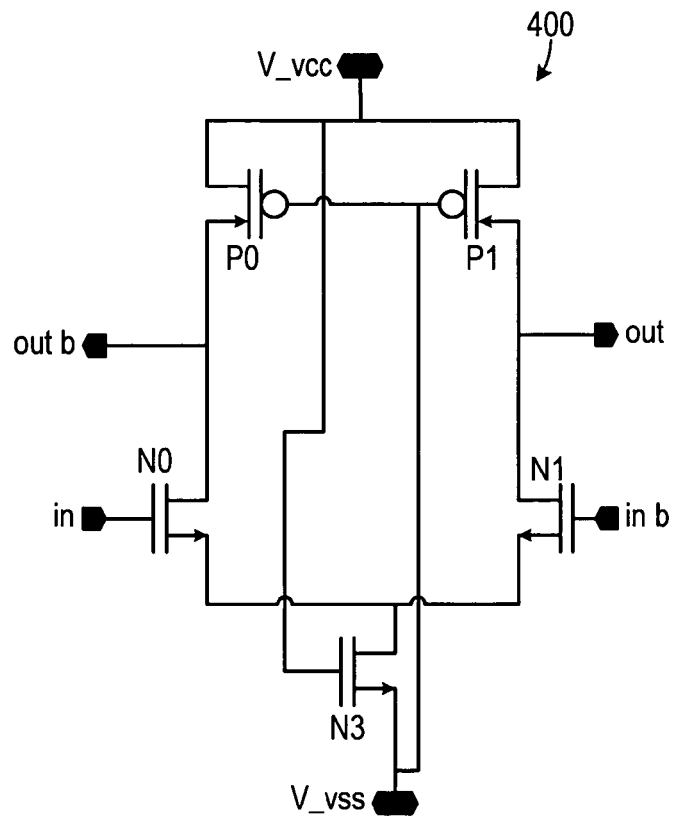
FIG. 4 is a schematic diagram of a differential amplifier that may be used in the phase-locked loop shown in FIG. 3.

In one embodiment, the phase-locked loop 300 could include a plurality differential amplifiers 310, 312 and 314 coupled in series with the differential output of the last differential amplifier 314 being electrically coupled to the differential input of the first differential amplifier 310. An exemplary differential amplifier 400 that may be used with this embodiment is shown in FIG. 4.

While the embodiments shown relate to removing jitter from an oscillating circuit, it will be readily understood by those in the electronic circuit design art that this invention could be employed to remove jitter from any circuit that is sensitive to jitter.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An oscillating circuit, comprising:
   a. a charge pump that generates a differential voltage signal that includes a first voltage signal (VC) and a second voltage signal (VCN) that is complimentary to the first voltage signal, the charge pump also powered by a first power supply voltage (VCC) and a complimentary second power supply voltage (VSS);
   b. a loop filter, responsive to the differential voltage signal, that generates a filtered differential voltage control signal that corresponds to the differential voltage signal, the filtered differential voltage control signal including a first filtered voltage signal corresponding to the first voltage signal in which high frequency components have been filtered out and a second filtered voltage signal corresponding to the second voltage signal in which high frequency components have been filtered out, the loop filter receiving power only from the first voltage signal and the second voltage signal, and not receiving power from the first power supply voltage or the second power supply voltage, the loop filter consisting of:
      i. a first sub-circuit that consists of two capacitors coupled to each other so as to be in parallel; and
      ii. a second sub-circuit that consists a first resistor in series with two capacitors that are coupled to each other so as to be in parallel and a second resistor in series with the two capacitors, the second sub-circuit coupled in parallel to the first sub-circuit at a first node and a second node, the first node defining the first filtered voltage signal and the second node defining the second filtered voltage signal;
   c. a first active element, that is gated by the first filtered voltage signal and that receives current from the first power supply voltage and that generates a first virtual voltage that is proportional to the first filtered voltage signal;
   d. a second active element, that is gated by the second filtered voltage signal and that receives current from the second power supply voltage and that generates a second virtual voltage that is proportional to the second filtered voltage signal; and
   e. a voltage controlled oscillator that receives current from the first virtual voltage input and the second virtual voltage input, the voltage controlled oscillator configured to generate a waveform having a frequency that is linearly proportional to a differential voltage between the first virtual voltage input and the second virtual voltage input,
   wherein the loop filter is responsive to the first voltage signal and the second voltage signal, and wherein the loop filter comprises a low pass filter that generates the first filtered voltage signal so as to remove jitter from the first voltage signal, and that generates the second filtered voltage signal so as to remove jitter from the second voltage signal, and wherein the first active element comprises a first transistor of a first type and wherein the second active element comprises a second transistor of a second type, and wherein the first transistor comprises an n-type transistor and wherein the second transistor comprises a p-type transistor.

2. The oscillating circuit of claim 1, wherein the voltage controlled oscillator is part of a phase-locked loop.

3. An oscillating circuit, comprising:

a. a charge pump that generates a differential voltage signal that includes a first voltage signal (VC) and a second voltage signal (VCN) that is complimentary to the first voltage signal, the charge pump also powered by a first power supply voltage (VCC) and a complimentary second power supply voltage (VSS);

b. a loop filter, responsive to the differential voltage signal, that generates a filtered differential voltage control signal that corresponds to the differential voltage signal, the filtered differential voltage control signal including a first filtered voltage signal corresponding to the first voltage signal in which high frequency components have been filtered out and a second filtered voltage signal corresponding to the second voltage signal in which high frequency components have been filtered out, the loop filter configured to remove jitter from the first voltage signal and the second voltage signal, the loop filter receiving power only from the first voltage signal and the second voltage signal, and not receiving power from the first power supply voltage or the second power supply voltage, the loop filter consisting of:

i. a first sub-circuit that consists of two capacitors coupled to each other so as to be in parallel; and ii. a second sub-circuit that consists a first resistor in series with two capacitors that are coupled to each other so as to be in parallel and a second resistor in series with the two capacitors, the second sub-circuit coupled in parallel to the first sub-circuit at a first node and a second node, the first node defining the first filtered voltage signal and the second node defining the second filtered voltage signal;

c. an n-type transistor, that is gated by the first filtered voltage signal and that receives current from the first power supply voltage and that generates a first virtual voltage that is proportional to the first filtered voltage signal;

d. a p-type transistor, that is gated by the second filtered voltage signal and that receives current from the second power supply voltage and that generates a second virtual voltage that is proportional to the second filtered voltage signal; and e. a voltage controlled oscillator, part of a phase-locked loop, that receives current from the first virtual voltage input and the second virtual voltage input, the voltage controlled oscillator configured to generate a waveform having a frequency that is linearly proportional to a differential voltage between the first virtual voltage input and the second virtual voltage input.

* * * * *